US009425806B2

(12) United States Patent
Tohzaka et al.

(10) Patent No.: US 9,425,806 B2
(45) Date of Patent: Aug. 23, 2016

(54) PHASE ESTIMATING DEVICE, SIGNAL GENERATING DEVICE, SYNCHRONIZING SYSTEM, AND SIGNAL PROCESSING DEVICE

(71) Applicant: KABUSHIKI KAISHA TOSHIBA, Tokyo (JP)

(72) Inventors: Yuji Tohzaka, Kanagawa (JP); Takafumi Sakamoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/543,102

(22) Filed: Nov. 17, 2014

(65) Prior Publication Data
US 2015/0137865 A1    May 21, 2015

(30) Foreign Application Priority Data
Nov. 19, 2013 (JP) .................. 2013-238653

(51) Int. Cl.
*H03L 7/00* (2006.01)
*H03L 7/06* (2006.01)
*H04B 10/61* (2013.01)

(52) U.S. Cl.
CPC .............. *H03L 7/06* (2013.01); *H04B 10/6165* (2013.01)

(58) Field of Classification Search
None
See application file for complete search history.

(56) References Cited

U.S. PATENT DOCUMENTS

| 8,126,333 | B2 | 2/2012 | Horiuchi |
| 2005/0018779 | A1* | 1/2005 | Griffin et al. ................. 375/259 |
| 2007/0115800 | A1* | 5/2007 | Fonseka et al. ............... 370/208 |
| 2014/0119080 | A1 | 5/2014 | Sakamoto et al. |

FOREIGN PATENT DOCUMENTS

| JP | 2009-290626 | 12/2009 |
| JP | 2014-087244 | 5/2014 |

* cited by examiner

*Primary Examiner* — Cassandra Cox
(74) *Attorney, Agent, or Firm* — Nixon & Vanderhye, P.C.

(57) ABSTRACT

According to one embodiment, a phase estimating device includes a periodic signal obtaining unit that obtains a first periodic signal, and a wireless time synchronizing unit that synchronizes a reference time with that of a signal generating device by wirelessly communicating with the signal generating device that outputs a second periodic signal according to phase information. The phase estimating device includes a reference time storing unit that stores the reference time synchronized with that of the signal generating device by the wireless time synchronizing unit. The phase estimating device includes a phase determining unit that obtains sampled times from the reference time storing unit at timing at which the first periodic signal rises above or falls below a predetermined level, and determines phase information on a phase of the first periodic signal based on the obtained sampled time and period information on a period of the first periodic signal.

13 Claims, 10 Drawing Sheets

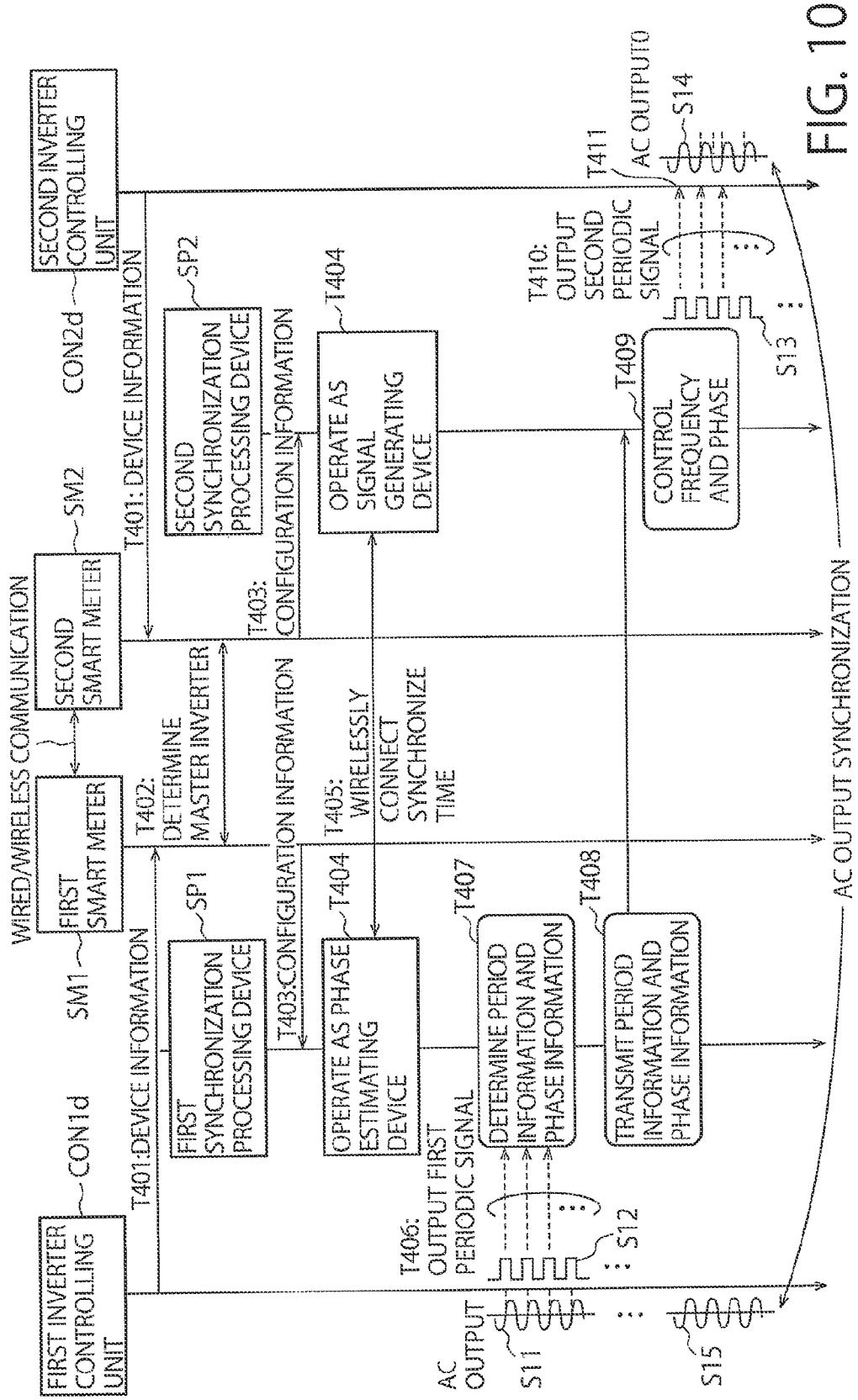

PHASE ESTIMATING DEVICE, SIGNAL GENERATING DEVICE, SYNCHRONIZING SYSTEM, AND SIGNAL PROCESSING DEVICE

CROSS-REFERENCE TO RELATED APPLICATIONS

This application is based upon and claims the benefit of priority from Japanese Patent Application No. 2013-238653, filed Nov. 19, 2013; the entire contents of which are incorporated herein by reference.

FIELD

Embodiments described herein relate generally to a phase estimating device, a signal generating device, a synchronizing system, and a signal processing device.

BACKGROUND

There have been developed systems for synchronizing periodic signals between a master unit and slave units in a network, the system in which the slave unit generates a second periodic signal having a frequency and a phase the same as those of a first periodic signal input into the master unit.

BRIEF DESCRIPTION OF THE DRAWINGS

FIG. 10 is a sequence diagram showing one example of the overall process flow of the inverter system 12 illustrating the specific application instance of the third embodiment.

DETAILED DESCRIPTION

According to one embodiment, a phase estimating device includes a periodic signal obtaining unit that obtains a first periodic signal. The phase estimating device includes a wireless time synchronizing unit that synchronizes a reference time with that of a signal generating device by wirelessly communicating with the signal generating device that outputs a second periodic signal according to phase information. The phase estimating device includes a reference time storing unit that stores the reference time synchronized with that of the signal generating device by the wireless time synchronizing unit. The phase estimating device includes a phase determining unit that obtains sampled times from the reference time storing unit at timing at which the first periodic signal rises above or falls below a predetermined level, and determines phase information on a phase of the first periodic signal based on the obtained sampled time and period information on a period of the first periodic signal. The phase estimating device includes a wireless transmitting unit that wirelessly transmits the phase information to the signal generating device.

Embodiments of the present invention will be described below with reference to the drawings. In each embodiment, signals being synchronized with each other means that frequencies and phases of these signals are identical, or a difference between the frequencies and a difference between the phases of these signals are within predetermined ranges.

First Embodiment

Figure 1:
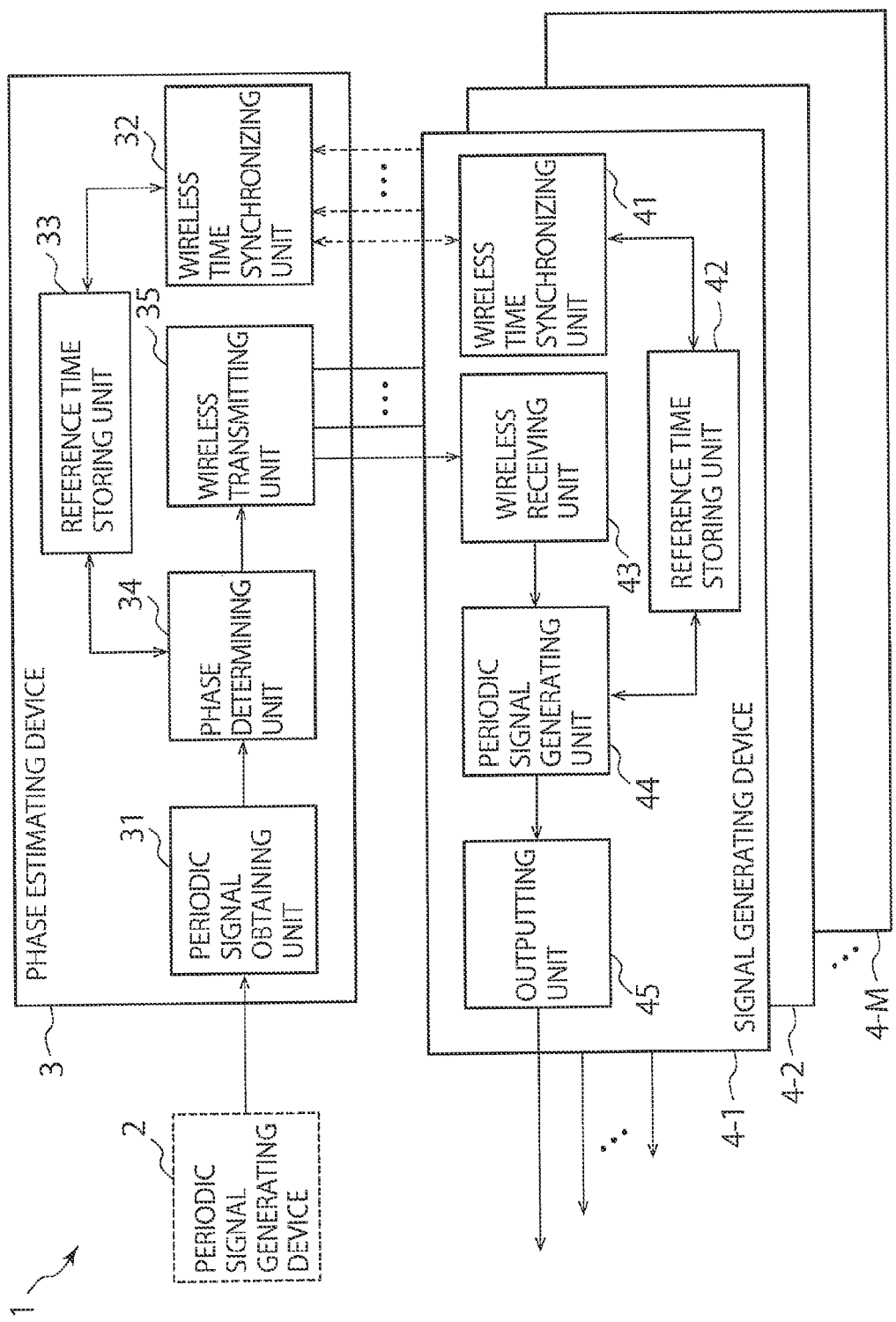
FIG. 1 is a schematic block diagram showing a configuration of a synchronizing system 1 in a first embodiment.

FIG. 1 is a schematic block diagram showing a configuration of a synchronizing system 1 in a first embodiment. The synchronizing system 1 includes a periodic signal generating device 2, a phase estimating device 3 electrically connected to the periodic signal generating device 2, and a signal generating device 4-$i$ ($i$ is an integer from 1 to "M", and "M" is a positive integer) of a number "M" of signal generating devices 4-1, 4-2, . . . , and 4-M that perform wireless communication with the phase estimating device 3. The signal generating devices 4-1, 4-2, . . . , and 4-M are hereafter collectively called a signal generating device 4. The periodic signal generating device 2 generates a first periodic signal, and outputs the generated first periodic signal to the phase estimating device 3. The phase estimating device 3 determines phase information on a phase of the first periodic signal, by using a reference signal calculated according to a reference time, as a reference of the phase. The signal generating device 4 outputs a second periodic signal that is synchronized with the first periodic signal according to the phase information.

A configuration of the phase estimating device 3 will be first described. The phase estimating device 3 includes a periodic signal obtaining unit 31 electrically connected to the periodic signal generating device 2, a wireless time synchronizing unit (first wireless time synchronizing unit) 32, and a reference time storing unit 33 electrically connected to the wireless time synchronizing unit 32.

The phase estimating device 3 further includes a phase determining unit 34 electrically connected to the periodic signal obtaining unit 31 and electrically connected to the reference time storing unit 33, and a wireless transmitting unit 35 electrically connected to the phase determining unit 34.

Into the periodic signal obtaining unit 31, the first periodic signal is input from the outside (for example, the periodic signal generating device 2 in the present embodiment). The periodic signal obtaining unit 31 obtains the first periodic signal in such a manner. The periodic signal obtaining unit 31 is an inputting interface such as a PIO (Programmed 10 or Parallel 10) and a GPIO (General Purpose 10). The periodic signal obtaining unit 31 is preferably hardware that can receive an analog signal with low latency. The periodic signal obtaining unit 31 outputs the obtained first periodic signal to the phase determining unit 34.

The reference time storing unit 33 is a register whose value increments using a quartz oscillator (not shown) as a reference, for example. The reference time storing unit 33 stores the reference time that is synchronized with that of the signal generating device 4 by the wireless time synchronizing unit 32.

The wireless time synchronizing unit 32 synchronizes the reference time with that of the signal generating device 4 by wirelessly communicating with the signal generating device 4. An absolute value of the reference time is thereby synchronized with the reference time of the signal generating device 4. Methods of this wireless time synchronization may be applications of well-known techniques, and the synchronization of the periodic signals implemented by the present invention is independent of the methods.

The phase determining unit 34 obtains sampled times from the reference time storing unit 33 at timing at which the first periodic signal rises above or falls below a predetermined level. For example, the first periodic signal is a signal that periodically reaches a first level and a second level, and has a pulse shape. The phase determining unit 34 then records a value of the reference time as a sampled time at a rising edge or a falling edge of the first periodic signal, for example. Note that the first periodic signal does not necessarily have a pulse shape as long as the phase determining unit 34 can obtain the reference time according to a level of the first periodic signal.

The phase determining unit 34 determines phase information on the phase of the first periodic signal based on the obtained sampled time and period information on a period of the first periodic signal, using the reference signal calculated according to the reference time as the reference of the phase. This determination process will be described hereafter. The phase determining unit 34 outputs the determined phase information to the wireless transmitting unit 35.

The wireless transmitting unit 35 wirelessly transmits this phase information to the signal generating device 4.

The wireless communication performed by the wireless transmitting unit 35 is enough to transmit several tens of bytes at most, and any standard can be employed. Relatively user-friendly and general-purpose wireless communication standards include the IEEE 802.11 standard (wireless LAN) and the IEEE 802.15.4 standard (ZigBee). The wireless transmitting unit 35 and the wireless time synchronizing unit 32 do not necessarily employ a single wireless communication standard or method.

Note that, in FIG. 1, the phase estimating device 3 and the signal generating device 4 are wirelessly connected directly with each other, but may be wirelessly connected via a wireless device that serves as a relay.

A configuration of the signal generating device 4 will be next described.

The signal generating device 4 includes a wireless time synchronizing unit (second wireless time synchronizing unit) 41, a reference time storing unit 42 electrically connected to the wireless time synchronizing unit 41, and a wireless receiving unit 43.

The signal generating device 4 further includes a periodic signal generating unit 44 electrically connected to the reference time storing unit 42 and the wireless receiving unit 43, and an outputting unit 45 electrically connected to the periodic signal generating unit 44.

The wireless time synchronizing unit 41 synchronizes the reference time with that of the phase estimating device 3 by wirelessly communicating with the phase estimating device 3.

The reference time storing unit 42 is a register whose value increments like the reference time storing unit 33 of the phase estimating device 3. The reference time storing unit 42 stores the reference time synchronized with that of the phase estimating device 3 by the wireless time synchronizing unit 41.

The wireless receiving unit 43 wirelessly receives the phase information transmitted from the wireless transmitting unit 35 of the phase estimating device 3, and notifies the periodic signal generating unit 44 of the received phase information.

The periodic signal generating unit 44 generates the second periodic signal synchronized with the first periodic signal based on the reference time stored in the reference time storing unit 42 and the phase information received by the wireless receiving unit 43. Here, the second periodic signal is a signal that periodically reaches the first level and the second level in a predetermined cycle.

Note that the periodic signal generating unit 44 may be implemented by dedicated hardware, or may be a program that controls, by software, the outputting unit 45 to be described hereafter to generate the second periodic signal. An operation of the periodic signal generating unit 44 will be described in detail hereafter.

The outputting unit 45 outputs the second periodic signal generated by the periodic signal generating unit 44. In the present embodiment, as an example, the outputting unit 45 is an outputting interface that outputs the second periodic signal in an analog signal. Note that the outputting unit 45 may be a PIO or a GPIO like the periodic signal obtaining unit 31 in the phase estimating device 3.

Figure 2:
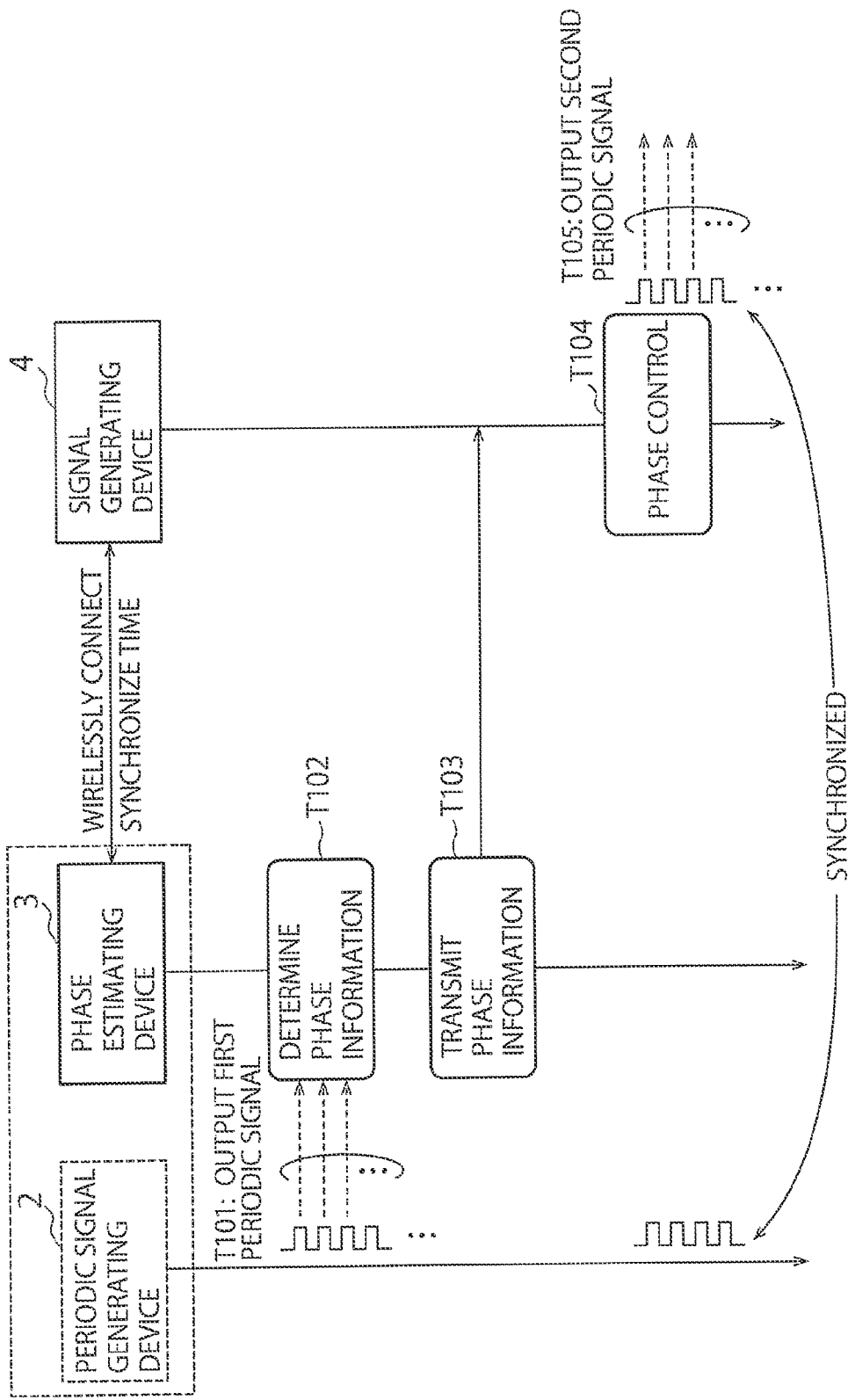
FIG. 2 is a sequence diagram showing an example of the overall process flow of the synchronizing system 1 in the first embodiment.

FIG. 2 is a sequence diagram showing an example of the overall process flow of the synchronizing system 1 in the first embodiment.

(T101) First, the periodic signal obtaining unit 31 of the phase estimating device 3 obtains the first periodic signal from the periodic signal generating device 2.

(T102) Next, the phase determining unit 34 of the phase estimating device 3 determines the phase information.

(T103) Next, the wireless transmitting unit 35 of the phase estimating device 3 wirelessly transmits the phase information to the signal generating device 4.

(T104) Next, the periodic signal generating unit 44 of the signal generating device 4 generates the second periodic signal synchronized with the first periodic signal, based on the phase information.

(T105) Next, the outputting unit 45 of the signal generating device 4 outputs the generated second periodic signal.

[Details of a Determination Process of the Phase Information]

Figure 3:
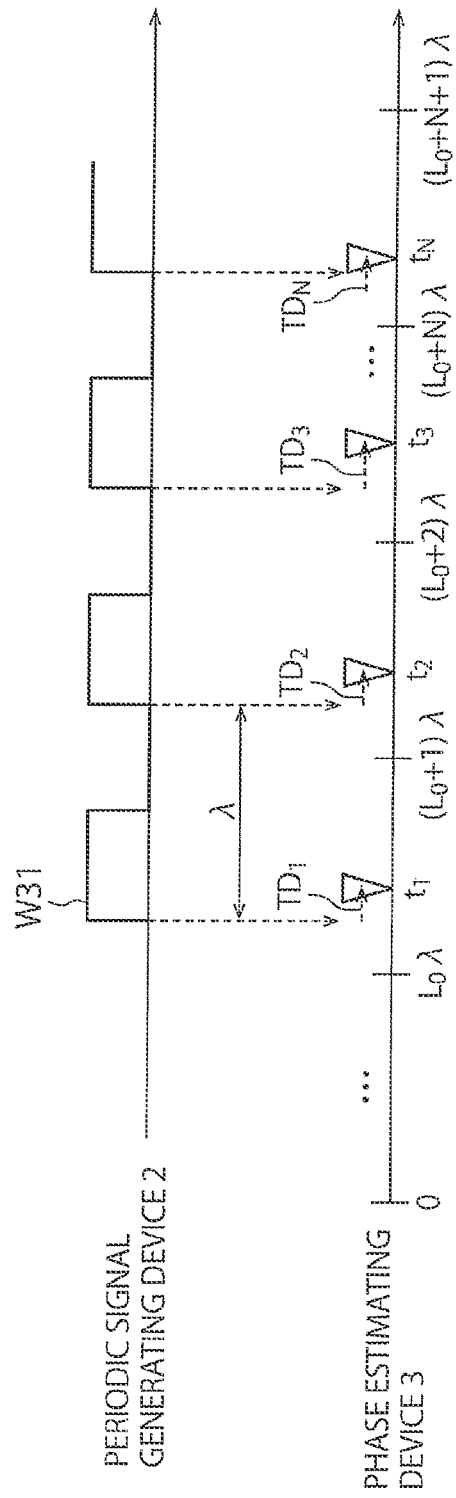
FIG. 3 is a diagram that illustrates CPU jitters and the sampled times.

A determination process of the phase information will be first described. FIG. 3 is a diagram that illustrates CPU jitters and the sampled times. FIG. 3 shows a waveform W31 of the first periodic signal output from the periodic signal generating device 2, and sampled times "$t_1$", . . . , "$t_N$" recorded by the phase estimating device 3 at the timings of rising edges of the first periodic signal. Note that the sampled times "$t_1$", "$t_2$", "$t_3$", . . . , "$t_N$" are delayed by "$TD_1$", "$TD_2$", "$TD_3$", . . . , "$TD_N$" from points in time of the rising edges of the first periodic signal due to the CPU jitters, respectively. For example, the sampled time $t_3$ is delayed by the delay time "$TD_3$" from the point in time of the rising edge of the first periodic signal, due to the CPU jitter.

As described in FIG. 1, the phase estimating device 3 receives the first periodic signal from the periodic signal generating device 2, and as shown in FIG. 3 for example, values of the reference times recorded at the timings of the rising edges of the first periodic signal are then held as the sampled times. Note that, with respect to the sampled times in FIG. 3

$$\{t_1, \ldots, t_N\}$$

"N" ("N" is a natural number) denotes the number of the sampled times, "λ" denotes the period, and "$L_0$" ("$L_0$" is a natural number) expressed by $$L_0 = \left\lfloor \frac{t_1}{\lambda} \right\rfloor$$

is the number of periods "λ" generated at the point in time "$t_1$" from a reference time 0. Here, $$\lfloor \bullet \rfloor$$

represents the floor function. If the values of the reference times can be obtained with relatively high accuracy through hardware processing or the like in the phase determining unit 34, the phase determining unit 34 calculates a phase "δ" according to, for example, the following expression.

[Expression 1]

$$\delta = \min\{t_k \bmod \lambda, k=1, \ldots, N\} \quad (1)$$

Here, X mod Y denotes a remainder resulting from dividing a dividend "X" by a divisor "Y". If the processing performed by the phase determining unit 34 is executed by software, the value of the reference time obtained through the software processing may include an error. In this case, the phase determining unit 34 may determine the phase "δ" using another expression instead of the expression (1). For example, if the sampled times are consecutively obtained substantially at pulse period intervals and include errors of delay in a positive direction due to the CPU jitters, the phase determining unit 34 may determine the phase "δ" according to the following expression.

[Expression 2]

$$\delta = \min\{t_k - (L_0 + k)\lambda, k=1, \ldots, N\} \bmod \lambda \quad (2)$$

Note that the residue calculation mod in the expression (2) is a calculation that outputs a number of zero or more, which has an effect of preventing the phase estimation result from becoming negative. The first periodic signal rises at every period "λ" because of the periodicity of the first periodic signal. However, in reality, the sampled times are delayed from the timings of the rising edges of the first periodic signal under the influence of the CPU jitters, as shown in FIG. 3. In the expression (2), the CPU jitter is smallest when $t_k - (L_0+k)\lambda$ is smallest, and the phase "δ" at this point is a phase least influenced by the CPU jitter.

In such a manner, the phase determining unit 34 selects a sampled time from among a plurality of sampled times, as an example, based on a period in time from detecting the timing until obtaining the sampled time, and determines the phase information based on the selected sampled time. Here, this sampled time selected by the phase determining unit 34 is a sampled time such that the period of time from detecting the timing until obtaining the sampled time is shortest. This allows for reducing the influence of the delay due to a processing jitter (CPU jitter as an example).

Note that the phase determining unit 34 may calculate predetermined statistics (such as an average and a mode of the sampled times) from the sampled times and calculate a residue as a phase by dividing one of the various calculated statistics by the divisor "λ".

In addition, the phase determining unit 34 may record a value of the phase, which is notified to the wireless transmitting unit 35, in a memory (not shown) every determination of the phase, and may notify the wireless transmitting unit 35 of the value of the phase only in the case where a difference between the value of the phase stored in the memory and a current value of the phase is equal to or more than a predetermined threshold value. The wireless transmitting unit 35 thereby transmits the phase information only if the difference between the stored value of the phase and the current value of the phase is equal to or more than the predetermined threshold value, which makes the best use of a communication band.

(Notification Process of the Phase Information)

A notification process of the phase information in T103 will be next described. The wireless transmitting unit 35 of the phase estimating device 3 wirelessly transmits the phase information that is calculated by the phase determining unit 34 as described above. Wireless transmitting methods may be any method as described above, and any communication protocol may be employed as long as the phase information can be transmitted as data and received by the wireless receiving unit 43 of the signal generating device 4. Note that, if the number of the existing signal generating devices 4 is two or more, considering the delay, multicasting transmission or broadcasting transmission is preferable rather than unicast transmission.

Furthermore, if the phase is calculated by the expression (1) or the expression (2), the greater the number "N" of the sampled times, the more enhanced the estimation accuracy of the phase is, whereas a delay time from a change in the phase until the notification is to be increased.

It is thus preferable to appropriately set the number "N" of the sampled times according to the acceptable estimation accuracy of the phase, and the delay time.

Phase control performed in T104 will be last described. The signal generating device 4 that has received the phase information estimated by the phase estimating device 3 as described above causes the periodic signal generating unit 44 to generate a periodic signal. The periodic signal generating unit 44 refers to the reference time to obtain a current time "τ", and determines a periodic signal starting time "T" from this current time "τ", and the period "λ" and phase "δ" of the periodic signal according to, for example, the following expression.

[Expression 3]

$$T = \left\lceil \frac{\tau}{\lambda} \right\rceil \lambda + \delta \quad (3)$$

Note that ⌈•⌉ represents the ceiling function. The periodic signal generating unit 44 may use a timer or the like in order to start generating the periodic signal at the periodic signal starting time "T". With respect to the method of generating the periodic signal, the periodic signal generating unit 44 may generate the periodic signal through the software processing as described above, or may generate the periodic signal using hardware having a PWM (Pulse Width Modulation) function.

Note that, if the wireless transmitting unit 35 of the phase estimating device 3 and the wireless receiving unit 43 of the signal generating device 4 are wirelessly connected with each other in a star network topology, the wireless transmitting unit 35 preferably fulfills a role equivalent to a hub. This means that the wireless transmitting unit 35 is, for example, an AP (Access Point) in the infrastructure mode of a wireless LAN. This is because, if the notification of the phase information is always directly transmitted in one hop, transmission delays are short, which increases use efficiency of frequencies and enhances reliability of the communication.

In the above described process, the phase estimating device 3 wirelessly transmits the phase "δ" determined by the phase determining unit 34, and the signal generating device 4 calculates the periodic signal starting time "T" from the received phase "δ", the known period "λ" of the periodic signal, and the current time "τ", according to the expression (3). The operation of the phase estimating device 3 in the first embodiment of the present invention is not limited to this, the phase determining unit 34 of the phase estimating device 3 may determine a periodic signal starting time "T" being a starting time of the second periodic signal, and the wireless transmitting unit 35 of the phase estimating device 3 may transmit this periodic signal starting time "T". At this point, the periodic signal starting time "T" is calculated by, for example, the following expression.

[Expression 4]

$$T' = \left(\left\lceil \frac{\tau}{\lambda} \right\rceil + D\right)\lambda + \delta \qquad (4)$$

Note that a constant "D" ("D" is a natural number) is a value that is set given the consideration of the processing delays and the transmission delays between the phase estimating device 3 and the signal generating devices 4, and if the number of the signal generating devices 4 is, for example, "M" ("M" is a natural number) like in the present embodiment and if delay times from the point in time at which the phase determining unit 34 determines the pulse starting time "T" until points in time at which the periodic signal generating units 44 of the signal generating devices 4 are ready to start generating the periodic signals are denoted by $$\{d_1, \ldots, d_M\}$$

the constant "D" is calculated by, for example, the following expression taking the maximum delay time into consideration.

[Expression 5]

$$D = \left\lceil \frac{\max\{d_k, k=1, \ldots, M\}}{\lambda} \right\rceil \qquad (5)$$

The calculated pulse starting time "T" is transmitted from the wireless transmitting unit 35 as described above, received by the wireless receiving unit 43 of the signal generating device 4, and notified to the periodic signal generating unit 44. The periodic signal generating unit 44 starts generating the periodic signal at the notified pulse starting time "T".

Also in this case, the phase determining unit 34 may record the value of the phase last notified to the wireless transmitting unit 35, in a memory (not shown) or the like. The phase determining unit 34 then calculates the periodic signal starting time "T" and notifies the wireless transmitting unit 35 of the calculated periodic signal starting time "T" only when the difference between the value of the phase stored in the memory or the like and the current value of the phase is equal to or more than the predetermined threshold value.

As described above, the phase determining unit 34 obtains the maximum delay time "D" as the phase information from among the delay times from a point in time at which the periodic signal generating unit 44 determines a starting time to start generating the second periodic signal, until a point in time at which the periodic signal generating unit 44 start generating the second periodic signal. The phase determining unit 34 then refers to the reference time storing unit 33 to obtain the current time, and determines the periodic signal starting time "T" based on the obtained current time, the period information on the period of the first periodic signal, the phase information, and the obtained maximum delay time "D". The wireless transmitting unit 35 then wirelessly transmits the periodic signal starting time "T" determined by the phase determining unit 34. The wireless receiving unit 43 then receives the periodic signal starting time "T" wirelessly transmitted by the wireless transmitting unit 35. The periodic signal generating unit 44 then starts generating the second periodic signal at the periodic signal starting time "T" received by the wireless receiving unit 43.

As described above, according to the synchronizing system of the first embodiment, the phase estimating device 3 estimates the phase information of the first periodic signal, and wirelessly transmits the estimated phase information. The one or more signal generating devices 4 receive this phase information, and output the second periodic signals synchronized with the first periodic signal, based on the reference time that is synchronized between the phase estimating device 3 and the signal generating device 4, and the received phase information. In such a manner, since the reference time is synchronized between the phase estimating device 3 and the signal generating device 4, the signal generating device 4 can generate the second synchronization signal by shifting the reference signal determined from the reference time and the known period by a phase indicated by the phase information. As a result, the signal generating device 4 can synchronize the second periodic signal with the first periodic signal without affected by any processing delay and any transmission delay.

The phase estimating device 3 has a simplified interface with the outside by including therein the phase determining unit 34 that estimates the phase. In addition, if the wireless transmitting unit 35 has a wireless time synchronization function, the phase estimating device 3 may determine the phase by making use of the reference time synchronized by the wireless transmitting unit 35. This allows the phase estimating device 3 to estimate the phase with relatively high accuracy.

The phase determining unit 34 determines, as an example, the phase information based on the sampled time of the smallest processing jitter included, out of the sampled times. This allows for reducing the influence of the delay due to a processing jitter (CPU jitter as an example).

Second Embodiment

A second embodiment will be next described. In the first embodiment, it is assumed that the period of the first periodic signal is known, but the second embodiment is significantly different therefrom in that a phase estimating device estimates the period of the first periodic signal or a frequency represented by an inverse thereof. In a synchronizing system 1b in the second embodiment, in addition to the configuration of the first embodiment, a phase estimating device 3b further determines the period of the first periodic signal, and transmits the determined period to signal generating devices 4b-1, 4b-2, ..., and 4b-M, together with the phase. Signal generating devices 4b generate the second periodic signals having the received period and the received phase, and output the generated second periodic signals.

Figure 4:
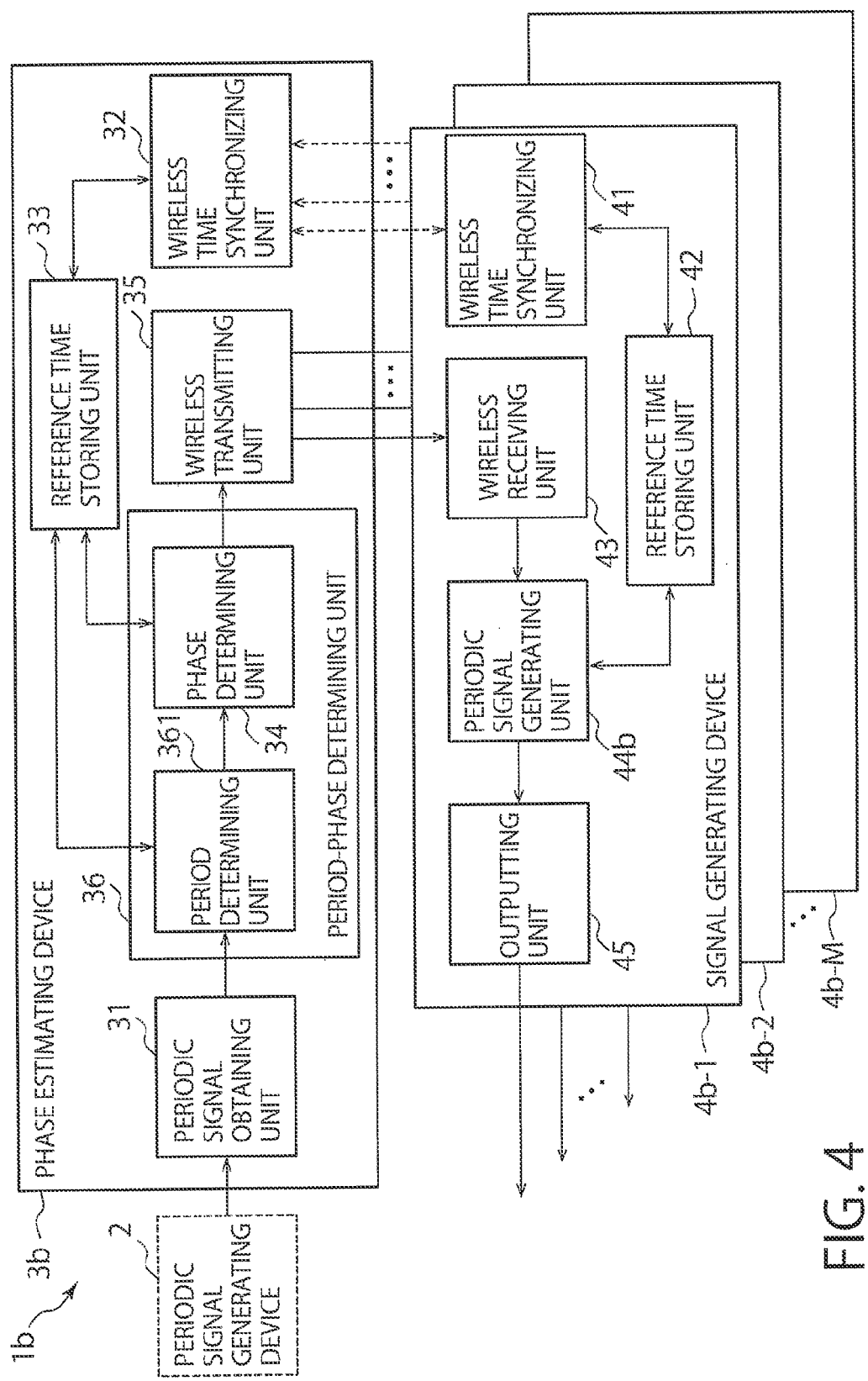
FIG. 4 is a schematic block diagram showing a configuration of the synchronizing system 1b in the second embodiment.

FIG. 4 is a schematic block diagram showing a configuration of the synchronizing system 1b in the second embodiment. Note that components common to those of FIG. 1 will be denoted by the same reference numerals, and the specific descriptions thereof will be omitted. The synchronizing system 1b includes the periodic signal generating device 2, the phase estimating device 3b electrically connected to the periodic signal generating device 2, and the number "M" of signal generating devices 4b-i (i is an integer from 1 to "M", and "M" is a positive integer) of signal generating devices 4b-1, 4b-2, ..., and 4b-M, which wirelessly communicate with the phase estimating device 3b. In such a manner, the synchronizing system 1b includes the one phase estimating device 3b and the one or more signal generating devices 4b-i. Hereafter, the signal generating devices 4b-1, 4b-2, ..., and 4b-M are collectively called as the signal generating device 4b.

The configuration of the phase estimating device 3b in the second embodiment is the configuration of the phase estimating device 3 in the first embodiment that includes a period determining unit 361 added thereto. In addition, a period-phase determining unit 36 includes this period determining unit 361 and the phase determining unit 34.

The period determining unit 361 obtains a plurality of sampled times at a plurality of timings at which the first periodic signal rises above or falls below a predetermined level, and determines period information on the period of the first periodic signal based on the plurality of obtained sampled times. This period information is, for example, the period of the first periodic signal or the frequency of the first periodic signal. The period determining unit 361 outputs the determined period information to the phase determining unit 34.

The period-phase determining unit 36 notifies the wireless transmitting unit 35 of a set of the period and the phase or a set of the period and a pulse starting time. This pulse starting time is a point in time at which the signal generating device 4b starts generating the second periodic signal. In the case where the timings at which the first periodic signal rises above the predetermined level are obtained by the period determining unit 361 as the plurality of the sampled time, this pulse starting time is, for example, a point in time at which the second periodic signal rises above the predetermined level.

The periodic signal generating unit 44b of the signal generating device 4b generates the second periodic signal based on the set of the period and the phase, or the information on the period and the pulse starting time. Descriptions of the configuration other than the device configuration of FIG. 4 will be omitted because they are the same as those of FIG. 1.

Figure 5:
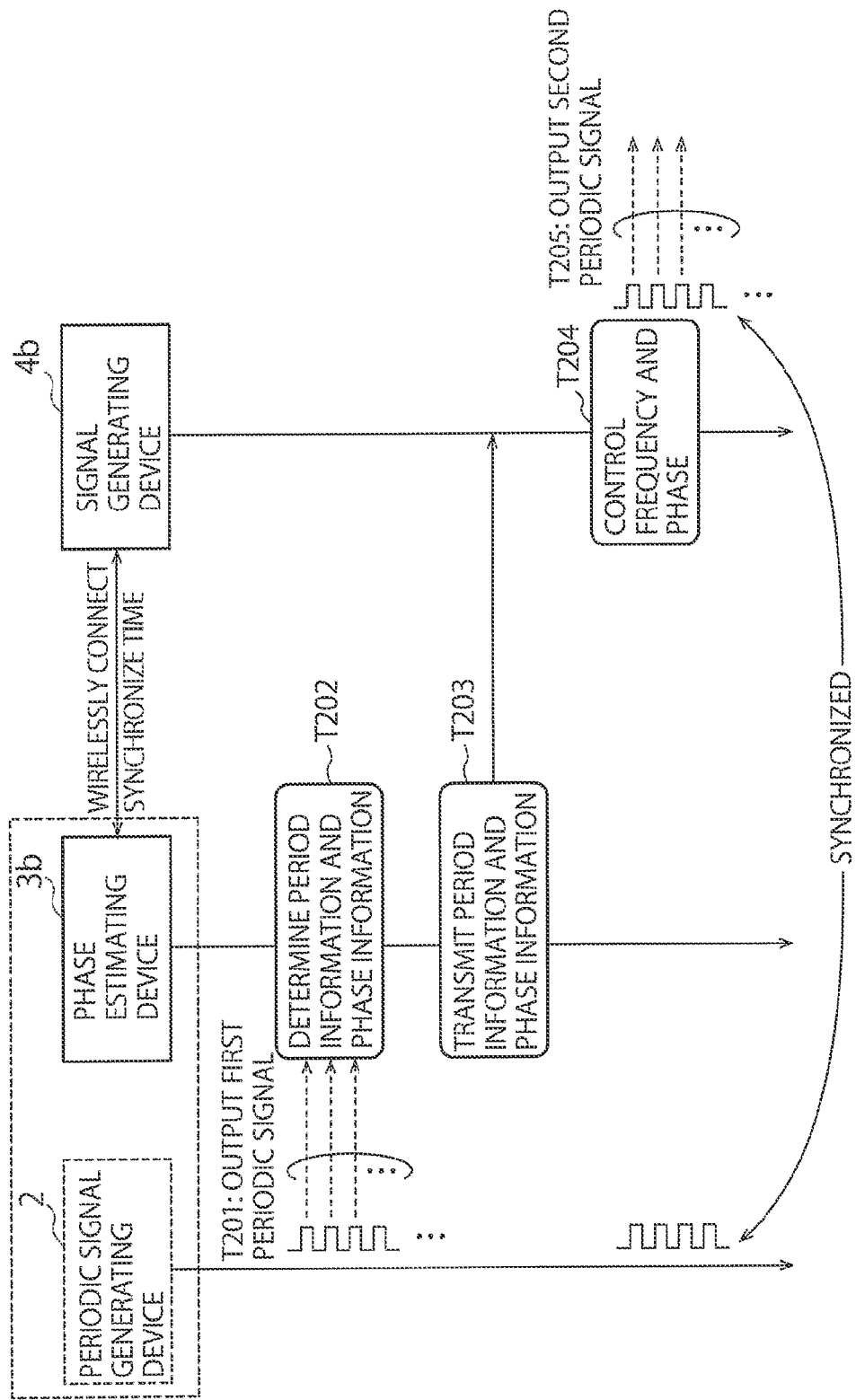
FIG. 5 is a sequence diagram showing one example of the overall process flow of the synchronizing system 1b according to the second embodiment.

FIG. 5 is a sequence diagram showing one example of the overall process flow of the synchronizing system 1b according to the second embodiment.

(T201) First, the periodic signal obtaining unit 31 of the phase estimating device 3b obtains the first periodic signal from the periodic signal generating device 2.

(T202) Next, the period determining unit 361 of the phase estimating device 3b determines the period information. The phase determining unit 34 then determines the phase information using this period information.

(T203) Next, the wireless transmitting unit 35 of the phase estimating device 3b wirelessly transmits the period information and the phase information to the signal generating device 4b. The set of the period and the phase or the set of the frequency and the phase is thereby wirelessly transmitted.

(T204) Next, the periodic signal generating unit 44b of the signal generating device 4b refers to the reference time storing unit 42 to obtain a current time, determines a starting time of the second periodic signal based on the obtained current time, the period information on the period of the second periodic signal, and the phase information, and starts generating the second periodic signal at the determined starting time.

(T205) Next, the outputting unit 45 of the signal generating device 4b outputs the generated second periodic signal.

[Details of a Determination Process of Frequency Information and Phase Information]

Details of a determination process of the frequency information and the phase information will be first described. As shown in FIG. 3, as an example, the period determining unit 361 obtains values of the reference times at the rising edges of the first periodic signal that is input via the periodic signal obtaining unit 31. The sample number "N" ("N" is an integer of two or more) of the consecutive sampled times are thereby held substantially at intervals of the period of the first periodic signal. The period "λ" of the first periodic signal is then calculated by the following expression.

[Expression 6]

$$\lambda = \frac{1}{N-1}\sum_{k=2}^{N}(t_k - t_{k-1}) \qquad (6)$$
$$= \frac{t_N - t_1}{N-1}$$

If the sampled times include errors in such a case where the sampled times are obtained through software processing, influence of the errors can be more relieved as the number "N" of the sampled times becomes greater. When the period "λ" of the first periodic signal is calculated, the frequency "f" can be calculated by inverting the period according to the following expression.

[Expression 7]

$$f = \frac{1}{\lambda} \qquad (7)$$
$$= \frac{N-1}{t_N - t_1}$$

Note that, as with the first embodiment, the number "N" of the sampled times is preferably set from an acceptable period or frequency of the pulse, the estimation accuracy of the phase, and the delay time.

The calculation to estimate the period and the frequency may employ the above method, as well as various statistics calculated from the sampled times. For example, the period determining unit 361 may estimate an average value or a mode of the sampled times as the period.

In addition, the period determining unit 361 may round (round off, for example) the estimated period or frequency to a predetermined decimal place. This allows for reducing an error included in the estimated period or frequency. The predetermined decimal place at this point is preferably determined from magnitude of the error and required resolution for the estimated value. For example, if the required resolution for the estimated value is down to the first decimal place, and a frequency is 50.02 Hz, the period determining unit 361 may determine the frequency as 50.0 Hz by rounding off the frequency to the first decimal place. In this example, the error of 0.02 Hz can be reduced.

In such a manner, the period determining unit 361 may perform one or both of a process of determining the period information from the plurality of the sampled times using the statistical process, and a process of rounding the period or the frequency obtained from the obtained period information to the predetermined decimal place.

Thereafter, the phase determining unit 34 determines, as described in the first embodiment, the phase using the period "λ" determined by the period determining unit 361 as described above. The phase determining unit 34 of the period-phase determining unit 36 notifies the wireless transmitting unit 35 of a set of the period and the phase or a set of the frequency and the phase. Note that, in the case where the set of the period and the phase or the set of the frequency and the phase last notified to the wireless transmitting unit 35 is recorded in a memory or the like, if differences between the values stored in the memory or the like and the current values are both within predetermined threshold values, the set may not be notified to the wireless transmitting unit 35. The wireless transmitting unit 35 thereby does not transmit the period information and the phase information if the set of the period and the phase or the set of the frequency and the phase does not much change, which reduces communication traffic.

Furthermore, if the difference between the value of the period or frequency stored in the memory or the like and the value of the current period or frequency exceeds a threshold value the same as or different from the above threshold value, the phase determining unit 34 of the period-phase determining unit 36 may not notify the wireless transmitting unit 35 of the set of the last estimated period and the phase or the set of the last estimated frequency and the phase, but provide notification of these estimation results next time. This has an effect of avoiding transmitting in vain the phase, which disturbs the second periodic signal output from the signal generating device 4 because the phase calculated by the expression (1) or the expression (2) using the period "λ" that is calculated by the expression (6) while the frequency changes, has a poor estimation accuracy.

Note that, if the frequency is notified as the period information in T203, the periodic signal generating unit 44b of the signal generating device 4b calculates the period by inverting the frequency, and starts generating the second periodic signal at the pulse starting time "T", through the process similar to that of the first embodiment of the present invention.

Note that there has been described the method of estimating, notifying, and applying the period or the frequency, but in addition thereto, the period-phase determining unit 36 may estimate the amount of change in frequency, and the wireless transmitting unit 35 may provide notification of the amount of change in frequency. For example, if the frequency linearly changes with respect to time, a frequency "f(τ)" can be represented by the following expression.

[Expression 8]

$$f(\tau) = \alpha\tau + \beta \quad (8)$$

Here, "α" denotes a gradient, and "β" denotes an intercept. To estimate the gradient "α" and the intercept "β" in the expression (8), consider linear regression using the least squares method, for example. First, for example, sampled intermediate times $\{t'_1, \ldots, t'_{N-1}\}$ and sample frequencies $\{\phi_1, \ldots, \phi_{N-1}\}$ are calculated from the sampled times $\{t_1, \ldots, t_N\}$, wherein $$t'_k = \frac{t_k + t_{k+1}}{2}, \phi_k = \frac{1}{t_{k+1} - t_k}$$

respectively. The gradient "α" and the intercept "β" are calculated using these values by the following expressions, respectively.

[Expression 9]

$$\alpha = \frac{\sum_{k=1}^{N-1}(t'_k - \overline{t'})(\phi_k - \overline{\phi})}{\sum_{k=1}^{N-1}(t'_k - \overline{t'})^2} \quad (9)$$

[Expression 10]

$$\beta = \frac{\sum_{k=1}^{N-1}(t'_k - \overline{t'})(\phi_k - \overline{\phi})}{\sum_{k=1}^{N-1}(t'_k - \overline{t'})^2} \cdot \overline{t'} + \overline{\phi} \quad (10)$$

In addition, the period-phase determining unit 36 may estimate a frequency sweep pattern. In this case, with respect to the frequency sweep pattern, relationships between time and frequency may be shared by the phase estimating device 3 and the signal generating devices 4b as the patterns in advance, and the patterns may be given indices. With respect to design of the frequency sweep pattern, it is preferable that the period-phase determining unit 36 of the phase estimating device 3 determines patterns easy to estimate, but any pattern allows for obtaining the effects of the present invention.

In addition, the wireless transmitting unit 35 may provide notification of information on the period, the frequency, the frequency acceleration, the frequency sweep pattern, and the phase, as well as the pulse starting time. The pulse starting time "T" for the fixed frequency has been described in the first embodiment of the present invention, and will be omitted here. The wireless transmitting unit 35 may provide notification of an ending time in addition to the starting time, or may provide notification of only the ending time added thereto. When only the ending time is notified, the ending time is preferably calculated such that the phase becomes zero at the ending time.

[Details of a Generation Process of the Second Periodic Signal in T204]

Next, details of a generation process of the second periodic signal in T204 will be described. If the information notified from the wireless transmitting unit 35 is the set of the period and the phase or the set of the frequency and the phase, the periodic signal generating unit 44b calculates the pulse starting time "T" by the method similar to that of the first embodiment of the present invention, and thereafter starts generating the second periodic signal that is set to have the period calculated from the notified period or frequency, at the pulse starting time "T"

In such a manner, the periodic signal generating unit 44b, as an example, refers to the reference time storing unit 33 to obtain the current time, determines the pulse starting time "T" being the starting time of the second periodic signal based on the obtained current time, the period information on the period of the second periodic signal, and the phase information, and starts generating the second periodic signal at the determined pulse starting time "T".

Alternatively, if the set of the period and the pulse starting time "T" or the set of the frequency and the pulse starting time "T" is notified from the wireless transmitting unit 35, the periodic signal generating unit 44b starts generating the second periodic signal that is set to have the period calculated from the notified period or frequency, at the pulse starting time "T".

Here, the pulse starting time "T" is also an example of the phase information. Thus, based on the period information on the period of the second periodic signal, and the phase information (here, the pulse starting time "T" as an example), the periodic signal generating unit 44b starts generating the second periodic signal that is set to have the period calculated from the period information, at the pulse starting time "T" indicated by the phase information.

Alternatively, if the gradient "α" and the intercept "β" in the expression (8), and the pulse starting time "T" are notified from the wireless transmitting unit 35, the periodic signal generating unit 44b refers to the reference time storing unit 33 to obtain the current time "τ", obtains the period calculated by the inversing the frequency of the expression (8), and starts generating the second periodic signal using the obtained setting of the period at the pulse starting time "T".

Here, the gradient "α" and the intercept "β" are information to calculate a relationship between the frequency of the second periodic signal and time. Therefore, based on the information to calculate the relationship between the frequency of the second periodic signal and time, and the phase information (here, the pulse starting time "T" as an example), the periodic signal generating unit 44b starts generating the second periodic signal that is set to have the period calculated from the information to calculate the relationship between the frequency of the second periodic signal and time, at the pulse starting time "T" indicated by the phase information.

Alternatively, if the gradient "α" and the intercept "β" in the expression (8), the pulse starting time "T", and the ending time are notified from the wireless transmitting unit 35, the periodic signal generating unit 44b refers to the reference time storing unit 33 to obtain the current time "τ", obtains the period calculated by inversing the frequency of the expression (8), starts generating the second periodic signal using the setting of the period calculated by inversing the frequency of the expression (8) at the pulse starting time "T", and does not change the frequency but maintains it after the ending time.

Alternatively, if the gradient "α" and the intercept "β" in the expression (8), and the ending time at which the phase of the second periodic signal becomes zero are notified, the periodic signal generating unit 44b calculates the pulse starting time at which the phase becomes zero after the current time by counting backward from the ending time. The periodic signal generating unit 44b then starts generating the second periodic signal using the setting of the period calculated by inversing the frequency of the expression (8), at the calculated pulse starting time, and thereafter does not change the frequency but maintains it after the ending time.

Note that, if the wireless transmitting unit 35 of the phase estimating device 3 and the wireless receiving unit 43 of the signal generating device 4 are wirelessly connected with each other through the star network topology, the wireless transmitting unit 35 preferably fulfills a role equivalent to a hub, as with the first embodiment of the present invention.

As described above, according to the second embodiment of the present invention, the period determining unit 361 obtains the plurality of sampled times from the reference time storing unit 33 at the plurality of timings at which the first periodic signal rises above or falls below the predetermined level, and determines the period information on the period of the first periodic signal based on the plurality of obtained sampled times. The phase determining unit 34 then determines the phase information based on the sampled times and the period information determined by the period determining unit 361. The wireless transmitting unit 35 then wirelessly transmits the determined period information and phase information. The periodic signal generating unit 44b of the signal generating device 4b generates the second periodic signal based on the reference time and the phase information.

Thus, in addition to the synchronizing system described in the first embodiment, even with the changes in the frequency of the first periodic signal that is input into the phase estimating device 3, the frequency of the second periodic signal can be matched with the frequency of the first periodic signal.

Note that the period information in the second embodiment may be a value obtained by multiplying the period of the first periodic signal by a predetermined magnification. In this case, the periodic signal generating unit 44b may calculate the period of the first periodic signal by dividing the period information by the predetermined magnification.

Alternatively, the period information in the second embodiment may be a value obtained by multiplying the frequency of the first periodic signal by a predetermined magnification. In this case, the periodic signal generating unit 44b may calculate the frequency of the first periodic signal by dividing the period information by the predetermined magnification.

(Specific Application Instance of the Second Embodiment)

Figure 6:
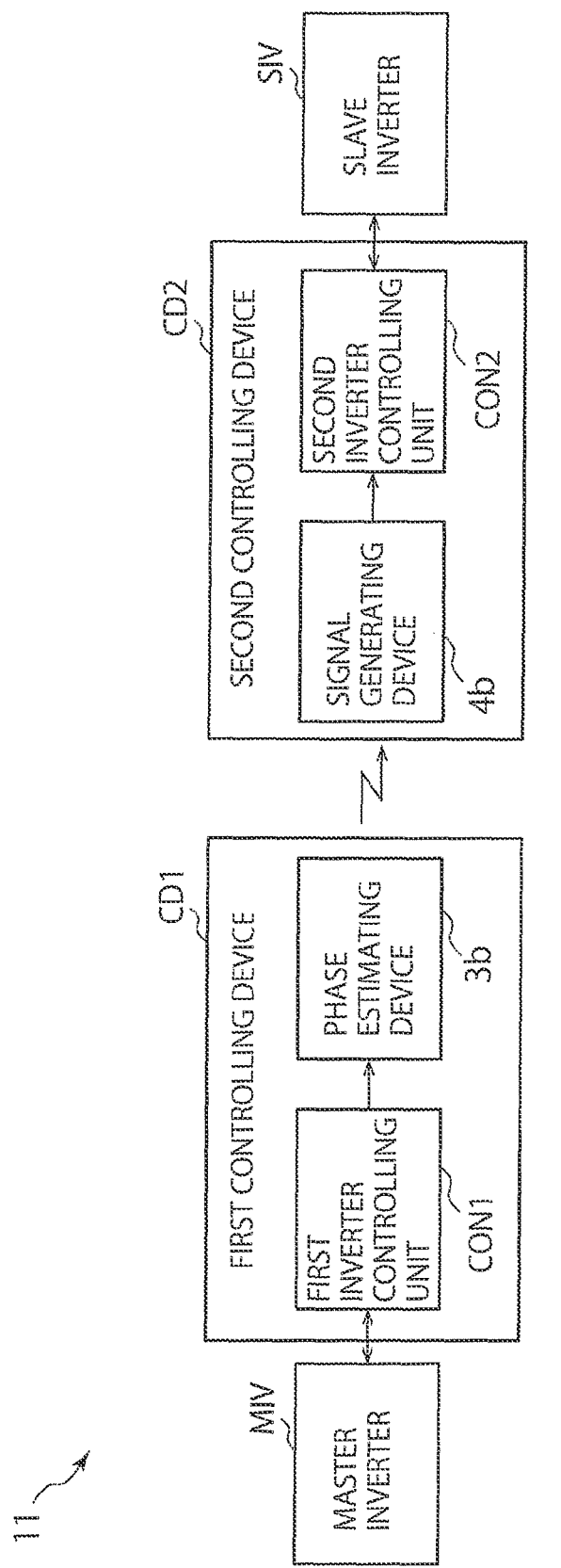
FIG. 6 is a schematic block diagram showing a configuration of an inverter system 11 that illustrates a specific application instance of the second embodiment.

FIG. 6 is a schematic block diagram showing a configuration of an inverter system 11 that illustrates a specific application instance of the second embodiment. The inverter system 11 applies the synchronizing system 1b implemented in the second embodiment to an inverter system, achieving a function of wirelessly synchronizing AC voltage outputs between inverters.

The inverter system 11 includes a master inverter MIV, a first controlling device CD1 that is electrically connected to the master inverter MIV and controls the master inverter MIV, a slave inverter SIV, and a second controlling device CD2 that is electrically connected to the slave inverter SIV and controls the slave inverter SIV.

The master inverter MIV converts DC voltage into AC voltage. With reference to a frequency and a phase of this converted AC voltage output, the slave inverter SIV matches a frequency and a phase of an AC voltage output to be output with the frequency and the phase of the AC voltage output that the master inverter outputs.

The first controlling device CD1 includes a first inverter controlling unit CON1 and the phase estimating device 3b.

The first inverter controlling unit CON1 controls the master inverter MIV. The first inverter controlling unit CON1 detects the AC voltage output that the master inverter MIV outputs. The first inverter controlling unit CON1 generates a first periodic signal having rising edges synchronized with zero crossing points of this AC voltage output, and outputs the generated first periodic signal to the phase estimating device 3b.

Meanwhile, the signal generating device 4b generates the second periodic signal synchronized with the first periodic signal output from the first inverter controlling unit CON1 by the method descried in the second embodiment of the present invention, and outputs the generated second periodic signal to the second inverter controlling unit CON2.

The second inverter controlling unit CON2 obtains, for example, the second periodic signal from the signal generating device 4b, and performs control so as to synchronize the rising edges of the obtained second periodic signal with the zero crossing points of the AC voltage output.

Figure 7:
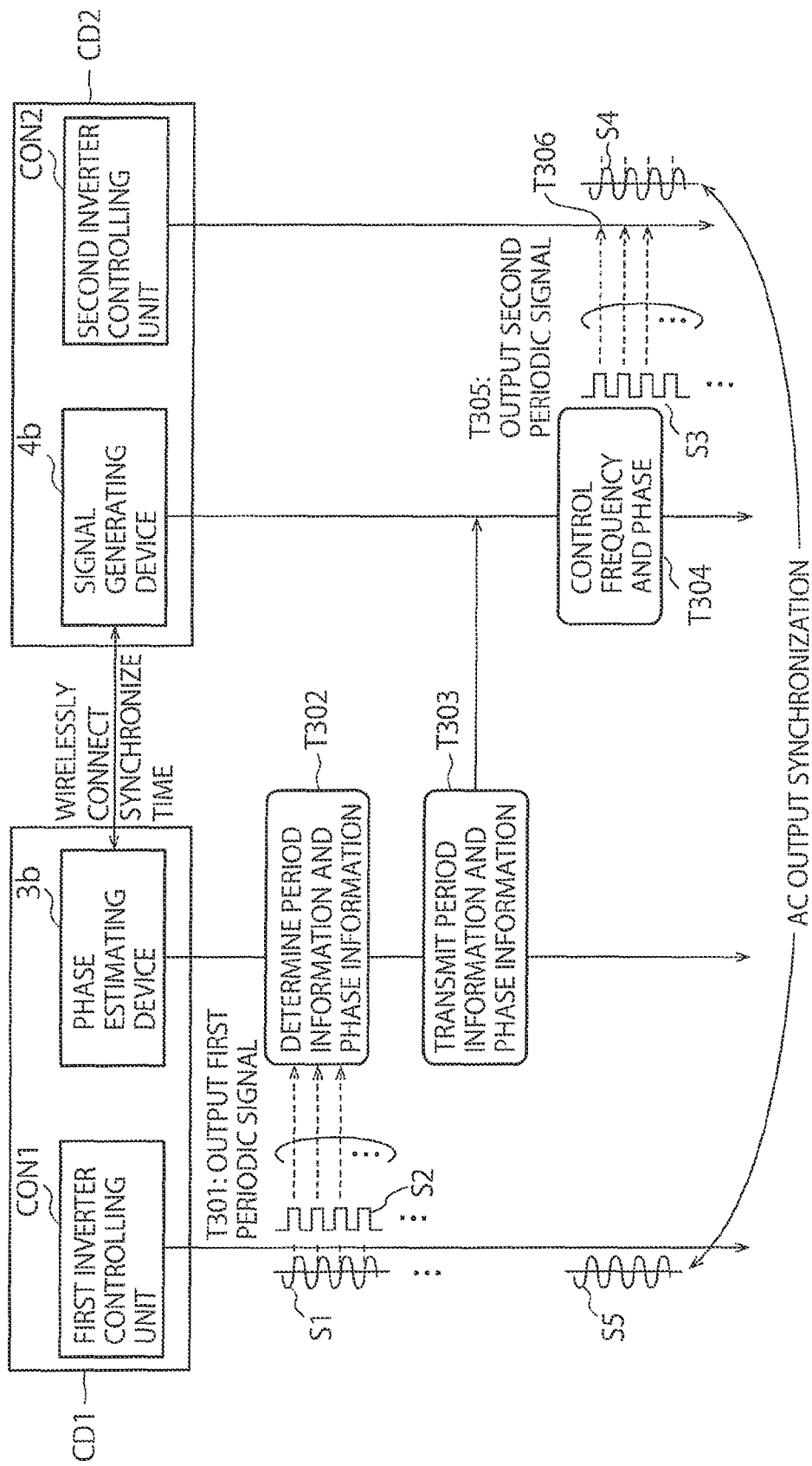
FIG. 7 is a sequence diagram showing one example of the overall process flow of the inverter system 11 illustrating the specific application instance of the second embodiment.

FIG. 7 is a sequence diagram showing one example of the overall process flow of the inverter system 11 illustrating the specific application instance of the second embodiment.

(T301) First, the first inverter controlling unit CON1 detects an AC voltage output S1 that the master inverter MIV outputs, and outputs a first periodic signal S2 synchronized with the detected AC voltage output S1, to the phase estimating device 3b.

(T302) Next, the period determining unit 361 of the phase estimating device 3b determines the period information. The phase determining unit 34 then determines the phase information based on this period information.

(T303) Next, the wireless transmitting unit 35 of the phase estimating device 3b wirelessly transmits the period information and the phase information to the signal generating device 4b. Thus, a set of the period and the phase or a set of the frequency and the phase is wirelessly transmitted.

(T304) Next, the periodic signal generating unit 44b of the signal generating device 4b refers to the reference time storing unit 33 to obtain the current time, and determines the starting time of the second periodic signal based on the obtained current time, the period information on the period of the second periodic signal, and the phase information, and starts generating the second periodic signal at the determined starting time.

(T305) Next, the outputting unit 45 of the signal generating device 4b outputs a generated second periodic signal S3.

(T306) Next, the second inverter controlling unit CON2 controls the slave inverter SIV such that the slave inverter SIV outputs an AC voltage output S4 synchronized with the second periodic signal S3. An AC voltage output S5 from the master inverter MIV and the AC voltage output S4 from the slave inverter SIV can be thereby synchronized, that is, the frequencies and the phases can be made identical to each other. As a result, the AC voltage outputs can be synchronized between remote inverters, and when these inverter outputs are connected, these AC voltage outputs are composed with a high degree of efficiency.

As described above, in the phase estimating device 3b in the second embodiment, the period determining unit 361 obtains the plurality of sampled times from the reference time storing unit 33 at the plurality of timings at which the first periodic signal rises above or falls below the predetermined level, and determines the period information on the period of the first periodic signal based on the plurality of obtained sampled times. The phase determining unit 34 then determines the phase information based on the sampled times and the period information determined by the period determining unit 361. The wireless transmitting unit 35 wirelessly transmits the determined period information and phase information.

In the signal generating device 4b in the second embodiment, the wireless receiving unit 43 further receives the period information on the period of the first periodic signal. The periodic signal generating unit 44b then generates the abovementioned second periodic signal based on the reference time, the phase information received by the wireless receiving unit 43, and the period information received by the wireless receiving unit 43.

As described above, if the AC frequency of the master inverter being a reference source of the synchronization of the AC voltage output changes and the period of the first periodic signal changes accordingly, the synchronizing system 1b in the second embodiment can match the period of the second periodic signal with the period of the first periodic signal, and can match the phase of the second periodic signal with the phase of the first periodic signal, using the period. The AC voltage outputs can be thereby synchronized between the inverters even if the AC frequency of the master inverter changes.

Third Embodiment

Figure 8:
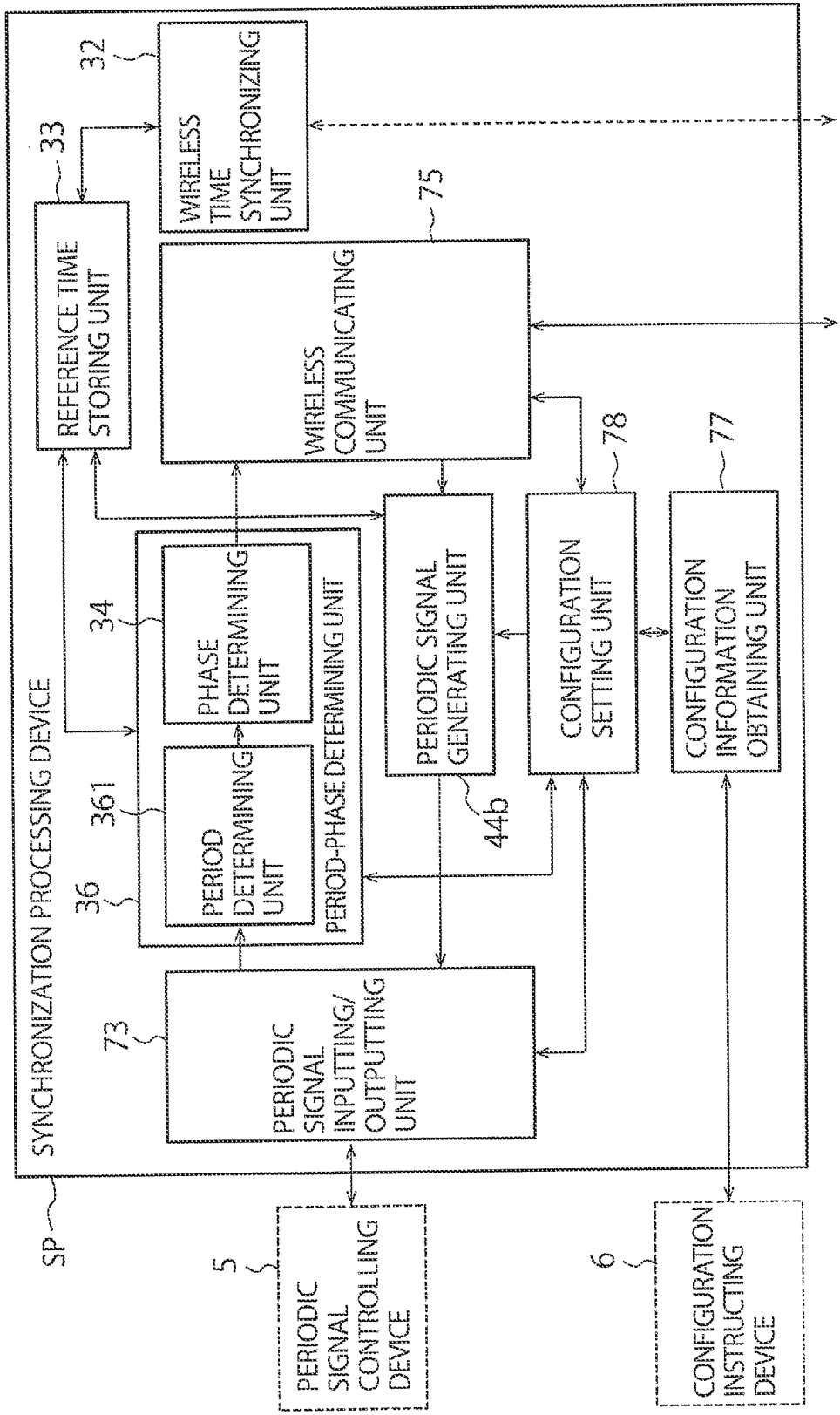
FIG. 8 is a schematic block diagram showing a configuration of a synchronization processing device SP in the third embodiment.

A third embodiment will be next described. FIG. 8 is a schematic block diagram showing a configuration of a synchronization processing device SP in the third embodiment. Note that components common to those of FIG. 4 will be denoted by the same reference characters, and the specific descriptions thereof will be omitted. The synchronization processing device SP in the third embodiment is different in that a configuration information obtaining unit 77 and a configuration setting unit 78 are newly added thereto as compared with the phase estimating device 3 and the signal generating device 4b in the second embodiment, in that a periodic signal inputting/outputting unit 73 can input or output signals, in that a wireless communicating unit 75 can perform one or both of the wireless transmission and the wireless reception, and in that both of the period-phase determining unit 36 and the periodic signal generating unit 44b are included therein.

That is, the synchronization processing device SP in the third embodiment has both of the functions of the phase estimating device 3 and the signal generating device 4b described in the second embodiment, and is operable as either the phase estimating device 3 or the signal generating device 4b, by switching the functions thereof in response to instructions from a configuration instructing device.

Note that a periodic signal controlling device 5 is the periodic signal generating device 2 shown in FIG. 4 when the synchronization processing device SP operates as the phase estimating device, and is a device such as the second inverter controlling unit CON2 shown in FIG. 6 when the synchronization processing device SP operates as the signal generating device.

The wireless time synchronizing unit 32 synchronizes the reference time with that of an other synchronization processing device by wirelessly communicating with the other synchronization processing device.

The reference time storing unit 33 stores the reference time synchronized with that of the other synchronization processing device by the wireless time synchronizing unit 32.

The periodic signal inputting/outputting unit 73 can obtain the first periodic signal, and can output the second periodic signal.

Note that, if the periodic signal inputting/outputting unit 73 is physically the same for both inputting and outputting, the interface thereof is efficiently used, but the periodic signal inputting/outputting unit 73 may be physically separated for inputting and outputting.

An input of the phase determining unit 34 is connected to an output of the periodic signal inputting/outputting unit 73, and the phase determining unit 34 determines the phase information on the phase of the first periodic signal.

An input of the wireless communicating unit 75 is connected to an output of the phase determining unit 34, and the wireless communicating unit 75 performs wireless communication with the other synchronization processing device.

An input of the periodic signal generating unit 44b is connected to an output of the wireless communicating unit 75, the output thereof is connected to the synchronization signal inputting/outputting unit 73, and the periodic signal generating unit 44b generates the second periodic signal synchronized with the first periodic signal.

The configuration information obtaining unit 77 obtains configuration information to determine the configuration of the synchronization processing device SP, from a configuration instructing device 6, and outputs the obtained configuration information to the configuration setting unit 78. Since there is a conceivable situation where the configuration changes during input/output of pulses, the configuration information obtaining unit 77 is preferably physically separated from the periodic signal inputting/outputting unit 73. A general-purpose interface for the configuration information obtaining unit 77 can include a UART (Universal Asynchronous Receiver Transmitter), an SPI (Serial Peripheral Interface), an SDIO (Secure Digital Input Output), but is not limited thereto.

Upon receiving the configuration information output from the configuration information obtaining unit 77, the configuration setting unit 78 configures some or all of the wireless communicating unit 75, the periodic signal generating unit 44b, the period-phase determining unit 36, and the periodic signal inputting/outputting unit 73 based on this configuration information.

The setting of the wireless communicating unit 75 includes, in the case where an employed wireless communication standard is a wireless LAN, for example, an SSID (Service Set Identifier), settings of encryption and authentication, a use channel, a setting of whether the wireless communicating unit 75 is an AP (Access Point, or master unit of the wireless LAN) or a STA (Station, or slave unit of the wireless LAN), and the like.

In addition thereto, the configuration setting unit 78 may further set an IP address and the like.

The configuration information includes information on which of the periodic signal generating unit 44b and the period-phase determining unit 36 (or a set of the phase determining unit 34 and the period determining unit 361) is to be activated. The configuration setting unit 78 thereby activates either the period-phase determining unit 36 (or the set of the phase determining unit 34 and the period determining unit 361) or the periodic signal generating unit 44b based on the configuration information.

If the configuration information contains information that the period-phase determining unit 36 (or the set of the phase determining unit 34 and the period determining unit 361) is to be activated, the synchronization processing device SP operates as the phase estimating device. In this case, the configuration setting unit 78 activates the period-phase determining unit 36 (or the phase determining unit 34 and the period determining unit 361), and the periodic signal inputting/outputting unit 73 receives an input of the first periodic signal.

The period determining unit 361 then obtains a plurality of sampled times from the reference time storing unit 33 at a plurality of timings at which the first periodic signal rises above or falls below the predetermined level, and based on the plurality of obtained sampled times, determines the period information on the period of the first periodic signal.

Next, the phase determining unit 34 obtains the sampled times from the reference time storing unit 33 at the timings at which the first periodic signal rises above or falls below the predetermined level. The phase determining unit 34 determines the phase information on the phase of the first periodic signal based on the obtained sampled time and the period information determined by the period determining unit 361, by using a reference signal calculated according to a reference time as a phase reference. The wireless communicating unit 75 then wirelessly transmits the determined period information and the phase information.

If the configuration information contains information that the periodic signal generating unit 44b is to be activated, the synchronization processing device SP operates as the signal generating device. In this case, the configuration setting unit 78 activates the periodic signal generating unit 44b, and the wireless communicating unit 75 wirelessly receives the period information and the phase information. The periodic signal generating unit 44b then generates the second periodic signal with the period calculated from the period information, based on the reference time and the phase information received by the wireless communicating unit 75. The periodic signal inputting/outputting unit 73 then outputs this second periodic signal.

The configuration information contains information on an initial setting relating to input/output of the PIO. The configuration setting unit 78 thereby performs the initial setting relating to the input/output of the PIO of the periodic signal inputting/outputting unit 73 based on the configuration information. In addition, the configuration information may contain any other information.

Note that the descriptions of the reference time storing unit 33 of the synchronization processing device SP and the wireless time synchronizing unit 32 will be omitted because they are similar to those of the first embodiment. In addition, the descriptions of the operation of the synchronization processing device SP as the phase estimating device 3 or the signal generating device 4b after configured by the configuration setting unit 78 will be omitted because they are similar to those of the second embodiment.

The configuration setting unit 78 sets a mode to either a first mode in which the synchronization processing device SP operates as the phase estimating device, or a second mode in which the synchronization processing device SP operates as the signal generating device, based on the configuration information obtained by the configuration information obtaining unit 78.

If the configuration setting unit 78 sets the mode to the first mode, the periodic signal inputting/outputting unit 73 obtains the first periodic signal. The period determining unit 361 then determines the period information on the period of the first periodic signal. The phase determining unit 34 then obtains sampled times from the reference time storing unit 33 at timings at which the first periodic signal rises above or falls below the predetermined level, and determines the phase information on the phase of the first periodic signal based on the obtained sampled time and the period information on the period of the first periodic signal. The wireless communicating unit then wirelessly transmits this phase information to, for example, the other synchronization processing device.

On the other hand, if the configuration setting unit 78 sets the mode to the second mode, the wireless receiving unit wirelessly receives the period information and the phase information from, for example, the other synchronization processing device. The periodic signal generating unit 44*b* then generates the second periodic signal based on the reference time, the phase information received by the wireless communicating unit 75, and the period information received by the wireless communicating unit 75. The periodic signal inputting/outputting unit 73 then outputs the second periodic signal generated by the periodic signal generating unit 44*b*.

Figure 9:
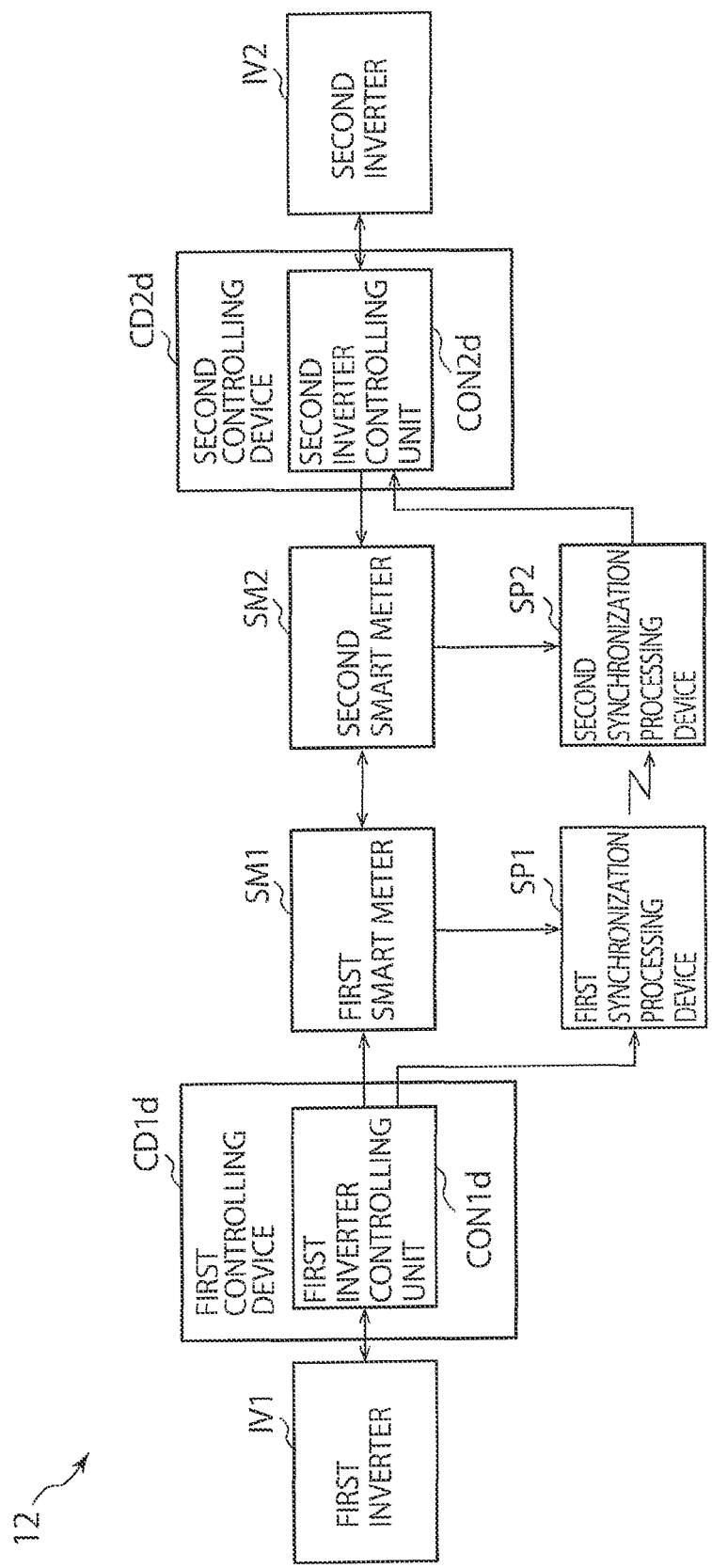
FIG. 9 is a schematic block diagram showing a configuration of an inverter system 12 illustrating a specific application instance of the third embodiment.

As a specific example of the third embodiment, an extended system of FIG. 8 is shown in FIG. 9. FIG. 9 is a schematic block diagram showing a configuration of an inverter system 12 illustrating a specific application instance of the third embodiment. The inverter system 12 includes a first inverter IV1, and a first controlling device CD1*d* that is electrically connected to the first inverter IV1 and controls the first inverter IV1.

The inverter system 12 further includes a first smart meter SM1 electrically connected to the first controlling device CD1*d*, and a first synchronization processing device SP1 electrically connected to the first controlling device CD1*d* and the first smart meter SM1.

The inverter system 12 further includes a second inverter IV2, and a second controlling device CD2*d* that is electrically connected to the second inverter IV2 and controls the second inverter IV2.

The inverter system 12 further includes a second smart meter SM2 electrically connected to the second controlling device CD2*d*, and a second synchronization processing device SP2 electrically connected to the second controlling device CD2*d* and the second smart meter SM2.

The first synchronization processing device SP1 and the second synchronization processing device SP2 are equivalent to the synchronization processing device SP in FIG. 8. The first synchronization processing device SP1 wirelessly communicates with the second synchronization processing device SP2, and synchronizes the reference time with that of the second synchronization processing device SP2.

The first smart meter SM1 or the second smart meter SM2 in FIG. 9 is equivalent to the configuration instructing device 6 in FIG. 8. In addition, the first controlling device CD1*d* in FIG. 9 is equivalent to the periodic signal controlling device 5 in FIG. 8.

The first smart meter SM1 communicates with the second smart meter SM2 in a wired or wireless manner, determining configuration information on the first synchronization processing device SP1 and the second synchronization processing device SP2.

The first controlling device CD1*d* includes a first inverter controlling unit CON1*d* that is electrically connected to the first inverter IV1, electrically connected to the first smart meter SM1, and electrically connected to the first synchronization processing device SP1. The first controlling device CD1*d* controls the first inverter IV1.

The second controlling device CD2*d* includes a second inverter controlling unit CON2*d* that is electrically connected to the second inverter IV2, electrically connected to the second smart meter SM2, and electrically connected to the second synchronization processing device SP2. The second controlling device CD2*d* controls the second inverter IV2.

In addition, as described above, in the inverter system 12 of the present embodiment, the first smart meter SM1 and the first controlling device CD1*d* are connected to each other so as to communicate with each other, and the second smart meter SM2 and the second controlling device CD2*d* are connected to each other so as to communicate with each other. This configuration is equivalent to the configuration of FIG. 8 in which the configuration instructing device 6 and the periodic signal controlling device 5 are electrically connected to each other, allowing for transmission and reception of control data.

Processing to determine one master inverter includes, for example, two processing methods of an autonomous distributed method and a centralized control method.

[(1) Autonomous Distributed Method]

Processing in the autonomous distributed method in which the smart meters independently determine a master inverter will be first described. The smart meters share device information on devices connected to the inverters (for example, information on power supplies or loads) through communication. Here, the devices connected to the inverters include solar panels, storage batteries or the like. The smart meters each hold a rule to determine the master inverter, and this rule is common to the smart meters. The smart meters then apply the rule to determine the master inverter to the information on the devices connected to the inverters, determining the master inverter from among the plurality of inverters. Since this rule is common to the smart meters, all the smart meter select the same inverter as the master inverter.

At this point, for example, each of the devices is given a priority order thereof, and the rule to determine the master inverter is, for example, a rule to set an inverter connected to a device having a highest priority order as the master inverter.

[(2) Centralized Control Method]

Processing in the centralized control method in which a certain smart meter determines the master inverter will be next described. The certain smart meter (hereafter, the first smart meter SM1 as an example) obtains device information on devices connected to the inverters, and applies the rule to determine the master inverter to the obtained device information, determining the master inverter from among the plurality of inverters. The first smart meter SM1 then notifies the other smart meters of the determined master inverter through communication.

FIG. 10 is a sequence diagram showing one example of the overall process flow of the inverter system 12 illustrating the specific application instance of the third embodiment.

(T401) First, the first inverter controlling unit CON1*d* transmits device information on devices (for example, solar panels, loads or the like) to which the first inverter IV1 is electrically connected, to the first smart meter SM1. At the same time, the second inverter controlling unit CON2*d* transmits device information on devices (for example, solar panels, loads or the like) to which the second inverter IV2 is electrically connected, to the second smart meter SM2.

(T402) Next, the first smart meter SM1 and/or the second smart meter SM2 determine the master inverter by any one of the abovementioned autonomous distributed method and the centralized control method.

(T403) Next, the first smart meter SM1 transmits configuration information containing information that the period-phase determining unit 36 is to be activated, to the first synchronization processing device SP1. At the same time, the second smart meter SM2 transmits configuration information containing information that the periodic signal generating unit 44b is to be activated to the second synchronization processing device SP2.

(T404) Next, the first synchronization processing device SP1 operates as the phase estimating device according to the received configuration information. At the same time, the second synchronization processing device SP2 operates as the signal generating device according to the received configuration information.

(T405) Next, the first synchronization processing device SP1 operating as the phase estimating device wirelessly transmits the reference time stored in the reference time storing unit 33 to the second synchronization processing device SP2 operating as the signal generating device. The first synchronization processing device SP1 operating as the signal generating device thereby receives this reference time, stores the received reference time in the reference time storing unit 33, and updates this stored reference time. In such a manner, the reference times can be synchronized between the first synchronization processing device SP1 operating as the phase estimating device and the second synchronization processing device SP2 operating as the signal generating device.

In FIG. 10, after the first synchronization processing device SP1 starts operating as the phase estimating device and the second synchronization processing device SP starts operating as the signal generating device, the operations of the inverter system 12 are basically the same as the operations of the inverter system 11 shown in FIG. 7.

(T406) The first inverter controlling unit CON1 detects an AC voltage output S11 that the master inverter MIV outputs, and outputs a first periodic signal S12 synchronized with the detected AC voltage output S11 to the first synchronization processing device SP1.

(T407) Next, the period determining unit 361 of the first synchronization processing device SP1 determines the period information. The phase determining unit 34 then determines the phase information using this period information.

(T408) Next, the wireless transmitting unit 35 of the first synchronization processing device SP1 wirelessly transmits the period information and the phase information to the second synchronization processing device SP2. A set of the period and the phase or a set of the frequency and the phase is thereby wirelessly transmitted.

(T409) Next, the periodic signal generating unit 44b of the second synchronization processing device SP2 refers to the reference time storing unit 33 to obtain a current time, determines a starting time of the second periodic signal based on the obtained current time, the period information on the period of the second periodic signal, and the phase information, and starts generating a second periodic signal S13 at the determined starting time.

(T410) Next, the outputting unit 45 of the second synchronization processing device SP2 outputs the generated second periodic signal S13.

(T411) Next, the second inverter controlling unit CON2d controls the second inverter IV2 such that the second inverter IV2 outputs an AC voltage output S14 synchronized with the second periodic signal S13. An AC voltage output S15 from the first inverter IV1 and the AC voltage output S14 from the second inverter IV2 can be thereby synchronized, that is, the frequencies and the phases can be made identical to each other.

Note that, if the configuration or the state of the inverter system 12 changes, the configuration information may be notified again such that the synchronization processing devices SP are reconfigured. In addition, the first smart meter SM1 or the second smart meter SM2 may provide notification of information to terminate the functions of the phase estimating device 3 and the signal generating device 4b to the synchronization processing devices SP, which in turn terminate the functions in response to the information.

In such a manner, the first smart meter SM1 or the second smart meter SM2 controls the synchronization processing devices SP. The synchronization processing devices SP thereby flexibly adjust to the changes in the system, and may start or terminate the functions at times.

Note that, if the first smart meter SM1 and the second smart meter SM2 are wirelessly connected to each other, the wireless communicating function included in the synchronization processing devices SP may be used. In addition, if the first smart meter SM1 mainly performs control in the inverter system 12, the first smart meter SM1 determines the frequency sweep pattern and/or the pulse starting time described in the second embodiment. The frequency sweep pattern and/or the pulse starting time is then notified to the synchronization processing device SP operating as the signal generating device via the synchronization processing device SP operating as the phase estimating device in advance, before a point in time at which a frequency of an AC output of the first inverter changes according to the frequency sweep pattern or before the pulse starting time.

Thereby, for example, the frequency of the second periodic signal output from the synchronization processing device SP operating as the signal generating device is changed to a frequency determined according to the frequency sweep pattern at the same time as the point in time at which the frequency of the AC output of the inverter changes according to the frequency sweep pattern. As a result, the frequencies of all the outputs from the inverters are simultaneously switched to the frequency determined according to the frequency sweep pattern, without delay.

Alternatively, for example, the second synchronization signal, which is output from the synchronization processing device SP operating as the signal generating device, rises at the pulse starting time. As a result, all the outputs of the inverters simultaneously rise at the pulse starting time, without delay. In such a manner, it is possible to change the frequencies and the phases of the AC outputs of the inverters included in the inverter system 12 to the same frequency and the phase, without delay.

Note that the first inverter controlling unit CON1d or the first synchronization processing device SP1 may determine the frequency sweep pattern and/or the pulse starting time.

In addition, notification of the power instruction value or a state of electric power system between the first smart meter SM1 and the second smart meter achieves a function of ensuring power supply during the downtime of some of the inverters, by the other inverters, or a function of isolating the inverter system, during power outage of an electric power system, from the power system to cause the inverter system to autonomously operate in cooperation as a local system. The detail descriptions thereof will be omitted.

In the present embodiment, the first inverter controlling unit CON1d can use the timings of the synchronized first periodic signal, and the second inverter controlling unit CON2d can use the timings of the synchronized second periodic signal. This implements an electric power system having high degrees in safety and efficiency, in which the synchronization accuracy of the entire inverter system 12 is guaranteed in any situation.

As described above, if the configuration information contains the information that the period-phase determining unit 36 is to be activated, the synchronization processing device SP in the third embodiment causes the configuration setting unit 78 to activate the period-phase determining unit 36, so as to operate as the phase estimating device. On the other hand, if the configuration information contains the information that the periodic signal generating unit 44b is to be activated, the synchronization processing device SP causes the configuration setting unit 78 to activate the periodic signal generating unit 44b, so as to operate as the signal generating device. The synchronization processing device SP thus can operate as either the phase estimating device or the signal generating device.

The second synchronization processing device SP2 operating as the signal generating device then matches the frequency and phase of the second periodic signal with the frequency and phase of the first periodic signal that is input into the first synchronization processing device SP1 operating as the phase estimating device, respectively. The second inverter then synchronizes the AC output thereof with this second periodic signal. Since the AC output that the first inverter IV1 outputs is synchronized with the first periodic signal, the AC output that the first inverter IV1 outputs can be synchronized with the AC output that the second inverter IV2 outputs.

Note that, if the synchronization processing device SP does not include the period determining unit 361 like the phase estimating device 3 in the first embodiment, the configuration information may contain information on which of the phase determining unit 34 and the periodic signal generating unit 44b is to be activated, instead of the information on which of the period-phase determining unit 36 and the periodic signal generating unit 44b is to be activated. The configuration setting unit 78 may thereby activate either the phase determining unit 34 or the periodic signal generating unit 44b based on the configuration information.

In this case, if the configuration information contains information that the phase determining unit 34 is to be activated, the configuration setting unit 78 activates the phase determining unit 34, and sets the mode to the first mode. The periodic signal inputting/outputting unit 73 then obtains the first periodic signal. The phase determining unit 34 then obtains sampled times from the reference time storing unit 33 at timings at which the first periodic signal rises above or falls below the predetermined level. The phase determining unit 34 then determines phase information on the phase of the first periodic signal based on the obtained sampled time and the period information on the period of the first periodic signal. The wireless communicating unit 75 then wirelessly transmits the determined phase information.

On the other hand, if the configuration information contains information that the periodic signal generating unit 44b is to be activated, the configuration setting unit 78 activates the periodic signal generating unit 44b, and sets the mode to the second mode. The wireless communicating unit 75 then wirelessly receives the phase information. The periodic signal generating unit 44b then generates the second periodic signal based on the reference time and the phase information received by the wireless communicating unit 75. The periodic signal inputting/outputting unit 73 then outputs this second periodic signal.

Note that the abovementioned various processes according to the phase estimating device 3, the signal generating device 4 or 4b, and the synchronization processing device SP in the embodiments may be performed by recording in a computer-readable storage medium a program to execute the processes of the phase estimating device 3, the signal generating device 4 or 4b, and the synchronization processing device SP in the embodiments, causing a computer system to read the program recorded in the storage medium, and executing the program by a processor.

Note that, the term "computer system" here may include an OS or hardware such as peripheral equipment. In addition, if the "computer system" uses a WWW system, a Web site provision environment (or display environment) is also included therein. Furthermore, the "computer-readable storage medium" means a nonvolatile memory such as a flexible disk, a magneto-optical disk, a ROM, and a flash memory, and a portable medium such as a CD-ROM, and a storage device such as a hard disk incorporated in the computer system.

Furthermore, the "computer-readable storage medium" includes a medium to retain the program for a certain period of time, like a volatile memory (e.g., a DRAM (Dynamic Random Access Memory)) installed inside the computer system being a server or a client with which the program is transmitted via a network such as the internet or via a communication line such as a telephone line. In addition, the program may be transmitted to another computer system from the computer system that stores this program in the storage device or the like thereof via a transmission medium, or by a transmission wave in the transmission medium. Here, the "transmission medium" to transmit the program means a medium having a function of transmitting information, like a network (communication network) such as the internet or a communication line such as a telephone line. In addition, the program may be for implementing part of the abovementioned functions.

Furthermore, the program may be so called a difference file (difference program), which implements the abovementioned functions in combination with a program that has already been recorded in the computer system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A phase estimating device comprising:
a computer including a processor;
a hardware interface configured to obtain a first periodic signal; and
hardware storage,
the computer being configured to control the phase estimating device to perform operations including:
synchronizing a reference time with that of a signal generating device by wirelessly communicating with the signal generating device that outputs a second periodic signal according to phase information;

storing, in the hardware storage, the reference time synchronized with that of the signal generating device;

obtaining a sampled time from the hardware storage at a timing at which the first periodic signal rises above or falls below a predetermined level, and determining a phase information on a phase of the first periodic signal based on the obtained sampled time and period information on a period of the first periodic signal; and transmitting the phase information to the signal generating device.

2. The phase estimating device according to claim 1, wherein the computer is configured to control the phase estimating device to perform further operations comprising selecting a sampled time from among a plurality of sampled times based on a period of time from detecting the timing until obtaining the sampled times, and determining the phase information based on the selected sampled time.

3. The phase estimating device according to claim 2, wherein the selected sampled time is a sampled time such that a period of time from detecting the timing until obtaining the sampled time is shortest.

4. The phase estimating device according to claim 1, wherein the computer is configured to control the phase estimating device to perform further operations comprising:
obtaining a plurality of sampled times from the hardware storage at a plurality of timings at which the first periodic signal rises above or falls below the predetermined level, and determining the period information on the period of the first periodic signal based on the plurality of obtained sampled times;
determining the phase information based on the sampled times and the determined period information; and
wirelessly transmitting the determined period information and phase information.

5. The phase estimating device according to claim 4, wherein the computer is configured to control the phase estimating device to perform further operations comprising one or both of determining the period information from the plurality of sampled times using statistical processing, and rounding a period or a frequency obtained from the period information to a predetermined decimal place.

6. A signal generating device comprising:
a computer including a processor; and
hardware storage,
wherein the computer is configured to control the signal generating device to perform operations comprising:
synchronizing a reference time with that of a phase estimating device by wirelessly communicating with the phase estimating device that determines phase information on a phase of a first periodic signal;
storing, in the hardware storage, the reference time synchronized with that of the phase estimating device;
wirelessly receiving the phase information transmitted from the phase estimating device;
reading the reference time from the hardware storage, and generating a second periodic signal synchronized with the first periodic signal based on the read reference time and the received phase information; and
outputting the generated second periodic signal.

7. The signal generating device according to claim 6, wherein the computer is configured to control the signal generating device to perform further operations comprising referring to the hardware storage to obtain a current time, and determining a starting time of the second periodic signal based on the obtained current time, period information on a period of the second periodic signal, and the phase information, and starting generating the second periodic signal at the determined starting time.

8. The signal generating device according to claim 6, wherein the computer is configured to control the signal generating device to perform further operations comprising receiving period information on a period of the first periodic signal, and
generating the second periodic signal based on the reference time, the received phase information, and the received period information.

9. A synchronizing system comprising a phase estimating device including a hardware interface configured to obtain a first periodic signal, a first computer and first hardware storage, and one or more signal generating devices each configured to wirelessly communicate with the phase estimating device and including a second computer and second hardware storage, wherein
the first computer is configured to control the phase estimating device to perform operations comprising:
synchronizing a reference time with that of the signal generating device by wirelessly communicating with a signal generating device;
storing, in the first hardware storage, the reference time synchronized with that of the signal generating device;
obtaining a sampled time from the first hardware storage at a timing at which the first periodic signal rises above or falls below a predetermined level, and determining a phase information on a phase of the first periodic signal based on the obtained sampled time and period information on a period of the first periodic signal; and
wirelessly transmitting the phase information to the signal generating device, and
the second computer of the signal generating device is configured to control the signal generating device to perform operations comprising:
synchronizing a reference time with that of the phase estimating device by wirelessly communicating with the phase estimating device;
storing, in the second hardware storage, the reference time synchronized with that of the phase estimating device;
wirelessly receiving the phase information from the phase estimating device;
generating a second periodic signal synchronized with the first periodic signal based on the reference time and the phase information; and
outputting the generated second periodic signal.

10. The synchronizing system according to claim 9, wherein the first computer is configured to control the phase estimating device to perform further operations comprising:
obtaining a maximum delay time from among delay times from a point in time at which a starting time is determined to start generating the second periodic signal, until a point in time at which generating the second periodic signal is started,
referring to the first hardware storage to obtain a current time, and determining a starting time of the second periodic signal based on the obtained current time, the period information on the period of the first periodic signal, the phase information, and the obtained maximum delay time,
wirelessly transmitting the determined starting time,
wherein the second computer of the signal generating apparatus is configured to perform further operations comprising:
receiving the starting time wirelessly transmitted from the phase estimating device, and starting generating the second periodic signal at the received starting time.

11. The synchronizing system according to claim 9, wherein the phase estimating device is a hub in a star network.

12. A synchronization processing device being operable as either a phase estimating device that determines phase information on a phase of a first periodic signal or a signal generating device that outputs a second periodic signal synchronized with the first periodic signal, the synchronization processing device comprising:
- a computer comprising a processor;
- wireless communication circuitry; and
- hardware storage,
  - wherein the computer is configured to control the synchronization processing device to perform operations comprising:
- synchronizing a reference time with that of another synchronization processing device by wirelessly communicating with the other synchronization processing device;
- storing, in the hardware storage, the reference time synchronized with that of the signal generating device;
- determining the phase information on the phase of the first periodic signal;
- generating the second periodic signal synchronized with the first periodic signal;
- obtaining configuration information to determine a configuration of the synchronization processing device; and
- setting, based on the configuration information, a mode to either a first mode in which the synchronization processing device operates as the phase estimating device or a second mode in which the synchronization processing device operates as the signal generating device, wherein
- if the mode is set to the first mode, the computer is configured to control the synchronization processing device to perform further operations comprising:
- obtaining the first periodic signal,
- obtaining a sampled time from the hardware storage at a timing at which the first periodic signal rises above or falls below a predetermined level, and determining the phase information on the phase of the first periodic signal based on the obtained sampled time and period information on a period of the first periodic signal, and
- wirelessly transmitting the phase information, and
- if the mode is set to the second mode, the computer is configured to control the synchronization processing device to perform further operations comprising:
- wirelessly receiving the phase information,
- generating the second periodic signal synchronized with the first periodic signal based on the reference time and the phase information, and
- outputting the generated second periodic signal.

13. The synchronization processing device according to claim 12, wherein the computer is configured to control the synchronization processing device to perform further operations comprising:
- obtaining a plurality of sampled times from the hardware storage at a plurality of timings at which the first periodic signal rises above or falls below the predetermined level, and determining the period information on the period of the first periodic signal based on the plurality of obtained sampled times;
- if the mode is set to the first mode,
  - determining the period information on the period of the first periodic signal,
  - determining the phase information based on the sampled times and the determined period information, and
  - wirelessly transmitting the determined period information and the determined phase information, and
- if the mode is set to the second mode,
  - wirelessly receiving the period information and the phase information,
  - generating the second periodic signal based on the reference time, the received phase information, and the received period information, and
  - outputting the second periodic signal.

* * * * *